US009282626B2

(12) United States Patent
Yoo et al.

(10) Patent No.: US 9,282,626 B2
(45) Date of Patent: Mar. 8, 2016

(54) PRINTED CIRCUIT BOARD AND METHOD FOR MANUFACTURING THE SAME

(75) Inventors: Jae Hyoun Yoo, Seoul (KR); Hyung Jong Kim, Seoul (KR); Jun Soo Park, Seoul (KR); Ki Yong Lee, Seoul (KR); Jin Goo Jeon, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 190 days.

(21) Appl. No.: 13/880,896

(22) PCT Filed: Jul. 1, 2011

(86) PCT No.: PCT/KR2011/004870
§ 371 (c)(1),
(2), (4) Date: Apr. 22, 2013

(87) PCT Pub. No.: WO2012/053728
PCT Pub. Date: Apr. 26, 2012

(65) Prior Publication Data
US 2013/0299223 A1    Nov. 14, 2013

(30) Foreign Application Priority Data

Oct. 20, 2010   (KR) .................. 10-2010-0102386
Oct. 29, 2010   (KR) .................. 10-2010-0107297

(51) Int. Cl.
*H05K 3/02*   (2006.01)
*H05K 3/04*   (2006.01)
(Continued)

(52) U.S. Cl.
CPC ............... *H05K 1/02* (2013.01); *H05K 3/4697* (2013.01); *H05K 3/0035* (2013.01); *H05K 2201/09127* (2013.01)

(58) Field of Classification Search
CPC ....... H05K 3/027; H05K 3/045; H05K 3/048; H05K 3/4697
USPC ................................ 174/259, 250; 427/97.6
See application file for complete search history.

(56) References Cited

U.S. PATENT DOCUMENTS 5,681,423 A * 10/1997 Sandhu et al. ............... 438/633
6,214,525 B1   4/2001 Boyko et al.
(Continued)

FOREIGN PATENT DOCUMENTS

CN    101617569 A    12/2009
JP      1022645 A     1/1998
(Continued)

OTHER PUBLICATIONS

International Search Report in International Application No. PCT/KR2011/004870, filed Jul. 1, 2011.
(Continued)

*Primary Examiner* — Jeremy C. Norris
*Assistant Examiner* — Nathan Milakovich
(74) *Attorney, Agent, or Firm* — Saliwanchik, Lloyd & Eisenschenk

(57) ABSTRACT

Disclosed are a printed circuit board and a method for manufacturing the same. The method for manufacturing the printed circuit board includes forming a base circuit board including a cavity circuit pattern in a cavity region on upper and lower portions of a substrate and internal circuit layers outside the cavity region, forming a cavity separation layer on the cavity circuit pattern, forming at least one pair of an insulating layer and a circuit layer on the base circuit board, cutting the insulating layer and the cavity separation layer provided on an etch stop pattern by controlling a focal length of a laser beam such that the laser beam reaches a surface of the base circuit board, and removing the insulating layer by separating the cavity separation layer to form the cavity. The cavity separation layer is formed on the cavity circuit pattern, and the resultant structure is cut to the cavity separation layer by using a laser so that the insulating layer is separated. Accordingly, the insulating layer in the cavity is easily removed.

17 Claims, 9 Drawing Sheets

(51) Int. Cl.
*H05K 3/46* (2006.01)
*H05K 1/02* (2006.01)
*H05K 3/00* (2006.01)

(56) References Cited

U.S. PATENT DOCUMENTS

| | | | | |
|---|---|---|---|---|
| 6,633,084 | B1 * | 10/2003 | Sandhu et al. | 257/774 |
| 6,730,857 | B2 * | 5/2004 | Konrad et al. | 174/257 |
| 8,400,776 | B2 * | 3/2013 | Sahara et al. | 361/765 |
| 8,647,926 | B2 * | 2/2014 | Shin et al. | 438/109 |
| 8,685,196 | B2 * | 4/2014 | Weichslberger et al. | 156/247 |
| 9,005,456 | B2 * | 4/2015 | You et al. | 216/13 |
| 2001/0054481 | A1 * | 12/2001 | Harada et al. | 156/289 |
| 2003/0036255 | A1 | 2/2003 | Sukuyama | |
| 2008/0142254 | A1 * | 6/2008 | Wang et al. | 174/259 |
| 2009/0026604 | A1 * | 1/2009 | Shin et al. | 257/702 |
| 2009/0126981 | A1 * | 5/2009 | Horiuchi et al. | 174/262 |
| 2009/0294027 | A1 | 12/2009 | Wang | |
| 2010/0009178 | A1 * | 1/2010 | Weidinger et al. | 428/336 |
| 2010/0252303 | A1 * | 10/2010 | Chang | 174/251 |
| 2011/0203836 | A1 * | 8/2011 | Yokota et al. | 174/250 |
| 2011/0284267 | A1 * | 11/2011 | Chang | 174/250 |
| 2011/0297644 | A1 * | 12/2011 | Cai et al. | 216/20 |
| 2012/0160803 | A1 * | 6/2012 | Cai | 216/20 |
| 2012/0181074 | A1 * | 7/2012 | Ishihara et al. | 174/261 |
| 2013/0020120 | A1 * | 1/2013 | Ishihara et al. | 174/262 |
| 2013/0276969 | A1 * | 10/2013 | Chang | 156/250 |
| 2014/0138130 | A1 * | 5/2014 | Chang et al. | 174/257 |
| 2014/0144675 | A1 * | 5/2014 | Hsu | 174/251 |
| 2014/0158414 | A1 * | 6/2014 | Baldwin et al. | 174/260 |
| 2014/0182917 | A1 * | 7/2014 | Mikado et al. | 174/262 |
| 2014/0216795 | A1 * | 8/2014 | Weichslberger et al. | 174/255 |

FOREIGN PATENT DOCUMENTS

| | | | |
|---|---|---|---|
| JP | 2002-334895 A | | 11/2002 |
| JP | 2006-086221 A | | 3/2006 |
| JP | 2007-266195 A | | 10/2007 |
| KR | 10-0677184 B1 | | 1/2007 |
| KR | 10-0890217 B1 | | 3/2009 |
| KR | 10-2009-0047315 A | | 5/2009 |
| KR | 101125356 B1 * | | 4/2012 |
| TW | 200942095 A | | 10/2009 |
| TW | 200950006 A | | 12/2009 |
| TW | 201031300 A | | 8/2010 |
| TW | 201038144 A | | 10/2010 |
| WO | WO-2009/011025 A1 | | 1/2009 |
| WO | WO 2010085830 A1 * | 8/2010 | ......... H05K 3/00 |
| WO | WO 2011099820 A2 * | 8/2011 | |

OTHER PUBLICATIONS

Office Action dated Aug. 14, 2015 in Chinese Application No. 201180061603.7.

* cited by examiner (a)

(b)

PRINTED CIRCUIT BOARD AND METHOD FOR MANUFACTURING THE SAME

CROSS-REFERENCE TO RELATED APPLICATIONS

This application is the U.S. national stage application of International Patent Application No. PCT/KR2011/004870, filed Jul. 1, 2011, which claims priority to Korean Application Nos. 10-2010-0102386, filed Oct. 20, 2010, and 10-2010-0107297, filed Oct. 29, 2010, the disclosures of each of which are incorporated herein by reference in their entirety.

TECHNICAL FIELD

The present invention relates to a printed circuit board and a method for manufacturing the same.

BACKGROUND ART

A PCB (Printed Circuit Board) is formed by printing a circuit line pattern on an electrical insulating substrate by using a conductive material such as copper (Cu), and refers to a board right before electronic components are mounted thereon. In other words, the PCB refers to a circuit board in which the mounting positions of the electronic components are determined, and a circuit pattern connecting the electronic components is fixedly printed on a flat plate in order to densely mount electronic devices on the flat plate.

In general, such a PCB is classified into a single-layer PCB and a multi-layer PCB which is a build-up board constructed by stacking PCBs in a multiple layer.

In particular, recently, in order to realize slim and light electronic products, system integration technologies have been required. To this end, technologies of manufacturing an embedded PCB and a cavity PCB have been spotlighted. The embedded PCB has advantages in that components mounted on the surface thereof are completely buried during the PCB process, thereby increasing the degree of freedom in the design of interconnections in the vicinity of the components. However, in the embedded PCB, the compatibility between the embedded components and PCB raw materials and the reworking of defected components are difficult. In addition, the embedded PCB has a limitation in the inspection of the components.

The cavity PCB has disadvantages in that components are not completely buried therein, but installed in a cavity formed in the direction of mounting a chip, so that the degree of freedom in design may be lowered. However, the cavity PCB is very effective in the reworking and inspection of the components that are difficult in the embedded PCB. In addition, although the cavity PCB has been greatly applied to technologies with a mold process scheme based on a LTCC (Low Temperature co-fired ceramic), the cavity PCB has been rarely applied to a PCB requiring a layer-by-layer scheme.

This is because the cavity region cannot exactly be formed, and circuits provided inside the cavity may be damaged in plating, image, and etching processes of a PCB process.

FIGS. 1A and 1B are schematic views showing the process of forming a cavity in the cavity PCB according to the related art.

As shown in FIGS. 1A and 1B, it is very difficult to form a cavity C, in which an electronic device chip is installed, in a PCB having a plurality of circuit patterns 1a, 1b, 2a, 3a, 4a, and 5 formed in multi-layer insulating layers 1, 2, 3, 4, and 5.

In other words, as shown in FIG. 1A, a scheme of selectively forming the cavity C in the PCB having a stack structure in the form of a complete product by using a milling bit M is mainly used. This scheme requires the process precision of 5 μm. However, since the process precision is actually in the range of about 50 μm to about 100 μm, the process for the cavity is very difficult. In addition, since the great difference occurs in the process accuracy, the reliability for a product may be degraded in mass production.

DISCLOSURE OF INVENTION

Technical Problem

As shown in FIG. 1B, a cavity may be selectively formed by accurately punching a board having the form of a complete product at a cavity position by using a punching machine. However, according to the above scheme, since a C-stage substrate is punched through a punching blade, the outer wall of the cavity is inevitably damaged. The damage in the outer wall of the cavity results in CAF (Cathode Anode Filament) short (a phenomenon in which glass filament in a prepreg is spread due to punching, so that vias 132, 142, and 152 in a PCB are electrically shorted) caused by moisture absorption, delamination, the damage of the bottom surface of the cavity, the price increase derived from the manufacturing cost of a punching jigs P, and the reduction in cavity design widths.

Solution to Problem

The embodiment provides a printed circuit board having a novel structure and a method for manufacturing the same.

The embodiment provides a printed circuit board and a method for manufacturing the same in which a cavity is formed by using a laser.

Advantageous Effects of Invention

According to the embodiment, the cavity separation layer is formed on the cavity circuit pattern, and the resultant structure is cut to the cavity separation layer by using a laser so that the insulating layer is separated. Accordingly, the insulating layer in the cavity can be easily removed.

In addition, the etch stopper is not formed at the boundary region of the cavity, but the etch depth is controlled by adjusting the focal length of the laser, so that the degree of freedom can be increased in the design of circuits in the cavity.

BEST MODE FOR CARRYING OUT THE INVENTION

Figure 1A:
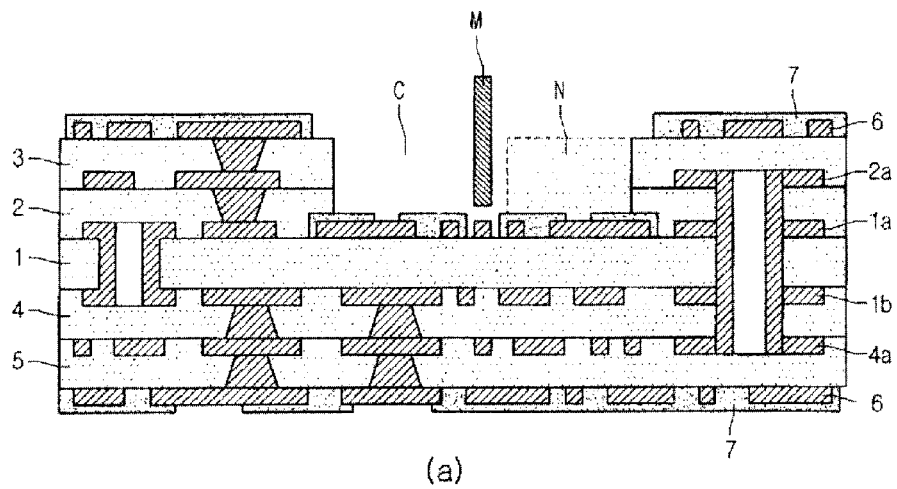
FIGS. 1A and 1B are sectional views showing a PCB according to the related art.
Figure 1B:
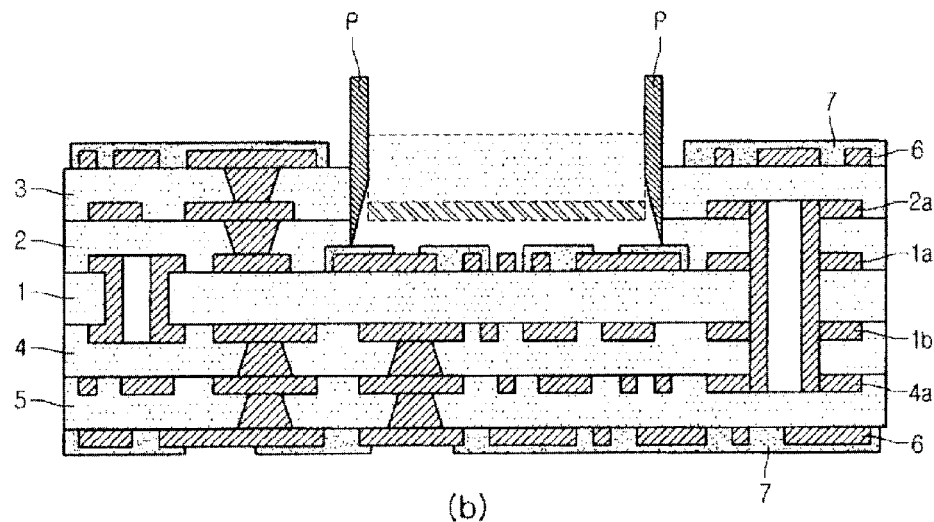

According to the embodiment, a printed circuit board including a cavity includes a base substrate, a circuit layer formed at an upper portion or a lower portion of the base substrate and including a cavity circuit pattern exposed by the cavity, and an insulating layer constituting the cavity and burring the circuit layer provided outside the cavity. The base substrate includes a laser spot formed along the edge of the cavity.

According to the embodiment, a printed circuit board including a cavity includes a base substrate, a circuit layer formed at an upper portion or a lower portion of the base substrate and including a cavity circuit pattern exposed by the cavity, an insulating layer constituting the cavity and burring the circuit layer provided outside the cavity, and a cavity separation pattern buried in the insulating layer and surrounding the cavity.

According to the embodiment, a method for manufacturing a printed circuit board includes forming a base circuit board including a cavity circuit pattern in a cavity region on upper and lower portions of a substrate and internal circuit layers outside the cavity region, forming a cavity separation layer on the cavity circuit pattern, forming at least one pair of an insulating layer and a circuit layer on the base circuit board, cutting the insulating layer and the cavity separation layer provided on an etch stop pattern by controlling a focal length of a laser beam such that the laser beam reaches a surface of the base circuit board, and removing the insulating layer by separating the cavity separation layer to form the cavity.

According to the embodiment, the cavity separation layer is formed on the cavity circuit pattern, and the resultant structure is cut to the cavity separation layer by using a laser so that the insulating layer is separated. Accordingly, the insulating layer in the cavity can be easily removed.

In addition, the etch stopper is not formed at the boundary region of the cavity, but the etch depth is controlled by adjusting the focal length of the laser, so that the degree of freedom can be increased in the design of circuits in the cavity.

MODE FOR THE INVENTION

Hereinafter, embodiments will be described in detail with reference to accompanying drawings so that those skilled in the art can easily work with the embodiments. However, the embodiments may have various modifications.

In the following description, when a predetermined part "cludes" a predetermined component, the predetermined part does not exclude other components, but may further include other components if there is a specific opposite description.

The thickness and size of each layer shown in the drawings may be exaggerated, omitted or schematically drawn for the purpose of convenience or clarity. In addition, the size of elements does not utterly reflect an actual size. The same reference numbers will be assigned the same elements throughout the drawings.

In the description of the embodiments, it will be understood that, when a layer (or film), a region, or a plate is referred to as being "on" or "under" another layer (or film), another region, or another plate, it can be "directly" or "indirectly" on the other layer (or film), region, plate, or one or more intervening layers may also be present. Such a position of the layer has been described with reference to the drawings.

The present invention provides a multi-layer printed circuit board capable of improving the degree of freedom in circuit design in a cavity by forming the cavity in the multi-layer printed circuit board through focal length control of a laser beam without an etch stop layer.

Hereinafter, a printed circuit board 100 according to one embodiment of the present invention will be described with reference to FIGS. 2 to 15.

Figure 2:
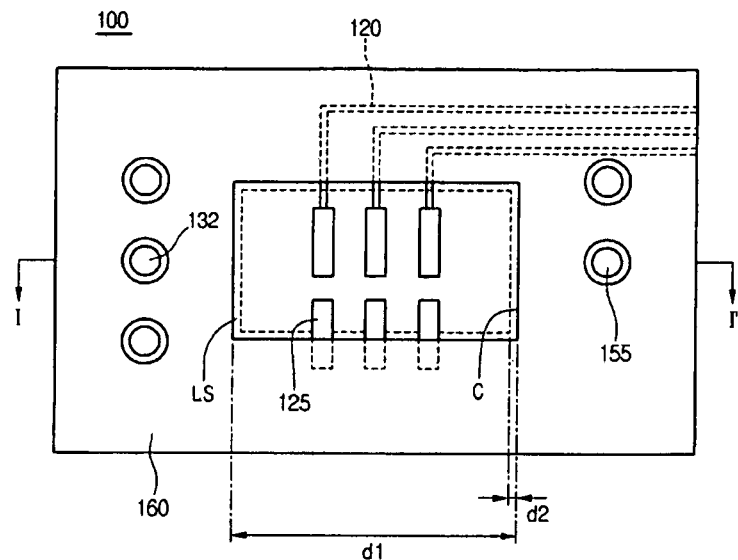
FIG. 2 is a top view showing a PCB according to an embodiment of the present invention.
Figure 3:
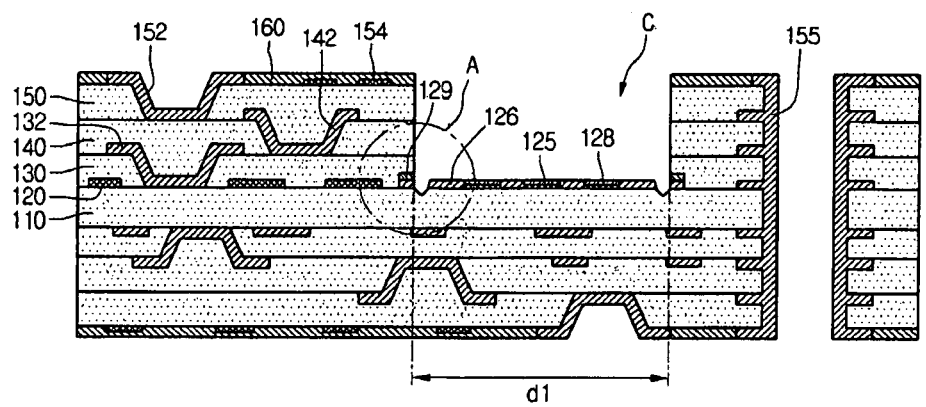
FIG. 3 is a sectional view taken along line I-I of the PCB shown in FIG. 2.
Figure 4:
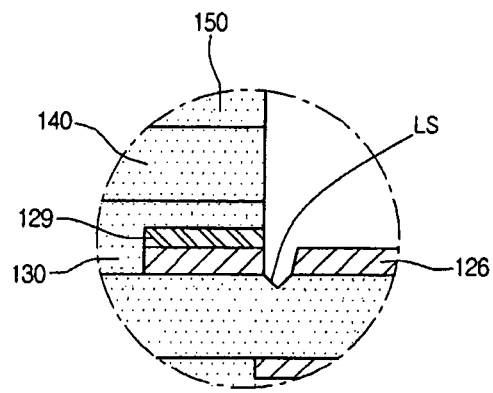
FIG. 4 is an enlarged view showing a region A of FIG. 3.

FIG. 2 is a top view showing the printed circuit board according to an embodiment of the present invention, and FIG. 3 is a sectional view taken along line I-I of the printed circuit board shown in FIG. 2. FIG. 4 is an enlarged view showing a region A of FIG. 3.

Referring to FIGS. 2 to 4, the printed circuit board 100 according to the present invention is a multi-layer printed circuit board including a circuit pattern layer having a multi-layer structure, and includes a base circuit board including internal circuit layers 120.

The base circuit board includes a base substrate 110 and internal circuit layers 120 formed at both of upper and lower portions of the base substrate 110.

The base substrate 110 includes an insulating substrate. The base substrate 110 may include thermosetting substrate, thermoplastic polymer substrate, a ceramic substrate, an organic-inorganic composite material substrate, or a glass fiber impregnation substrate. If the base substrate 110 includes a polymer resin, the base substrate 110 may include an epoxy-based insulating resin, or may include polyimide-based resin.

The internal circuit layers 120 are formed at the upper and lower portions of the base substrate 110. A portion of the internal circuit layer 120 includes a cavity circuit pattern 125 exposed in a cavity region for a cavity C with a first width d1.

The cavity circuit pattern 125 extends in line with the internal circuit layer 160 extending from the bottom surface of the cavity C and buried in an insulating layer to surround the cavity C.

In this case, the base substrate 100 includes a laser spot (LS) formed along the boundary region of the cavity C.

The LS is formed through a laser drilling process of forming the cavity C, and formed at a predetermined depth along the boundary region of the cavity C.

In addition to the cavity circuit pattern 125, the internal circuit layer 120 is buried in the insulating layer 130. A plurality of insulating layers 140 and 150 are formed on the first insulating layer 130.

The second and third insulating layers 140 and 150 formed on the first insulating layer 130 may include resin insulating layers including the same material.

Although FIG. 3 shows the insulating layers 130, 140 and 150, the number of the insulating layers may vary, and insulating layers and interlayer circuit layers different from each other in number may be formed at the upper and lower portions of the base circuit board.

An interlayer circuit layer (not shown) is formed between two of the first to third insulating layers 130, 140, and 150, and vias 132, 142, and 152 are formed in the first to third insulating layers 130, 140, and 150 so that the vias 132, 142, and 152 connect interlayer circuit layers to each other.

Through a typical build-up process, the insulating layers 130, 140, and 150 may be stacked, the interlayer circuit layers may be formed, and the vias 132, 142, and 152 may be formed.

An outer circuit layer 154 is formed on the third insulating layer 150 serving as the upper most layer in the printed circuit board 100 of FIG. 3, and the via 152 connecting the outer circuit layer 154 to the lower interlayer circuit layer is formed in the third insulating layer 150.

The printed circuit board 100 may include a conductive through hole 155 penetrating from the upper most layer of the printed circuit board 100 to the lower most layer of the printed circuit board 100.

A cover layer 160 may be staked on the third insulating layer 150 to bury the outer circuit layer 154 and expose the through hole 155 and the via 152.

The cover layer 160 may include a dry film or a solder resist.

Hereinafter, the inner part of the cavity C will be described in detail. A plurality of cavity circuit patterns 125 are formed in the cavity region for the cavity C having the first width d1.

As described above, the LS is formed at the boundary region of the cavity C while surrounding the cavity circuit pattern 125. The LS is not formed at a region for a connection pattern of connecting the cavity circuit pattern 125 to the internal circuit layer 120 buried in the first insulating layer 130.

The LS is formed through the laser drilling, and the connection pattern serves as a stopper of the laser drilling.

As described above, since a laser stopper is not additionally formed, the cavity circuit pattern 125 can be connected to the internal circuit layer 120 on the same layer. Accordingly, the degree of freedom in the circuit design is increased, so that the thickness of the circuit substrate is reduced.

A portion of a cavity separation layer 129 is formed around the cavity C in the first insulating layer 130 surrounding the cavity C. The cavity separation layer 129 is buried in the first insulating layer 130 at a higher position than that of a metallic layer constituting the internal circuit layer 120 and the cavity circuit pattern 125.

The cavity separation layer 129 represents weaker adhesion strength with the metallic layer constituting the lower cavity circuit pattern 125 than with the upper first insulating layer 130. The cavity separation layer 120 includes heat-resistant material, preferably, a portion of a releasing film having the form of a tape.

The cavity separation layer 129 may include an insulating layer having the form of a tape and including one of epoxy, phenolic resin, prepreg, polyimide, and ABF. Preferably, the cavity separation layer 129 may include a portion of a polyimide tape.

As described above, since the cavity C is formed by cutting the insulating layers 130, 140, and 150 and the cavity separation layer 129 using a laser without forming a stopper at the boundary region of the cavity C subject to the laser drilling, the cavity circuit pattern 125 can be freely designed.

Hereinafter, a method for manufacturing the printed circuit board 100 of FIG. 2 will be described with reference to FIGS. 5 to 15.

Figure 5:
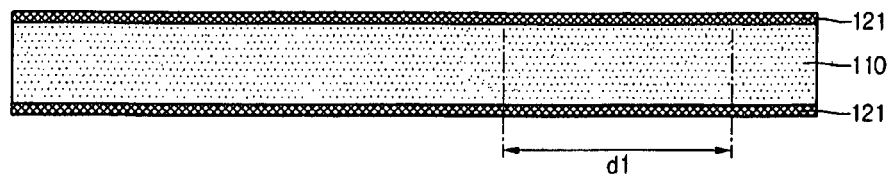
FIGS. 5 to 15 are sectional views showing a method for manufacturing the PCB of FIG. 2.

First, as shown in FIG. 5, a copper foil composite including metallic layers 121 formed at both lateral sides of the insulating base substrate 110 is prepared.

The metallic layer 121 may include a copper foil including copper (Cu) or may include the alloy including aluminum (Al), gold (Au), or silver (Ag).

Next, as shown in FIG. 5, the metallic layers 121 formed at both lateral sides of the base substrate 110 are patterned to form the internal circuit layers 120.

Portions of the internal circuit layers 120 are the cavity circuit patterns 125 exposed in the cavity C. The cavity circuit patterns 125 are formed by etching the same metallic layer as that of the internal circuit layer 120 formed at a region other than the cavity C in such a manner that the cavity circuit patterns 125 are connected to the internal circuit layers 120.

Figure 6:
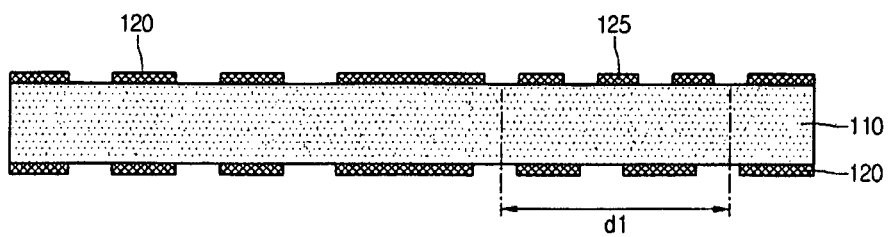

As shown in FIG. 6, a structure including the internal circuit layer 120 formed at both lateral sides of the base substrate 110 is defined as the base circuit board.

Figure 7:
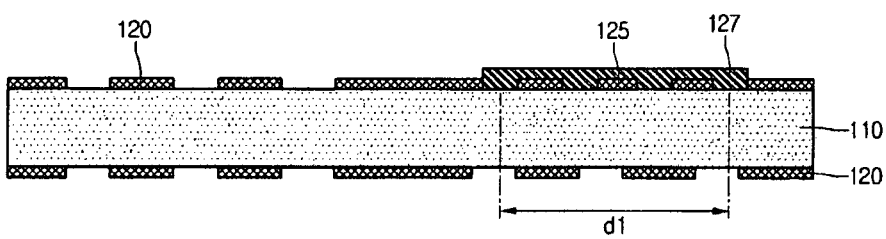
Figure 8:
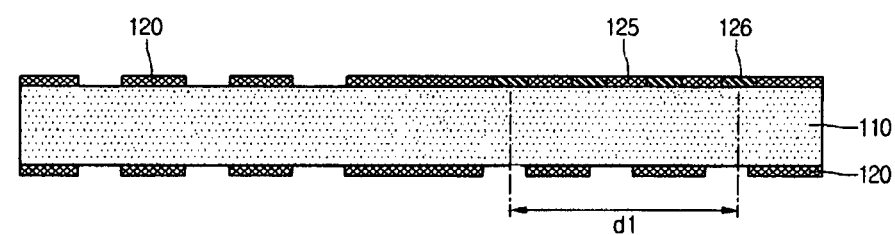

Then, as shown in FIG. 7, after printing a solder resist (PSR) 127 in the cavity region, the solder resist 127 of the cavity region is exposed, thereby forming a solder resist pattern 126 between the cavity circuit patterns 125 in the cavity region as shown in FIG. 8.

Figure 9:
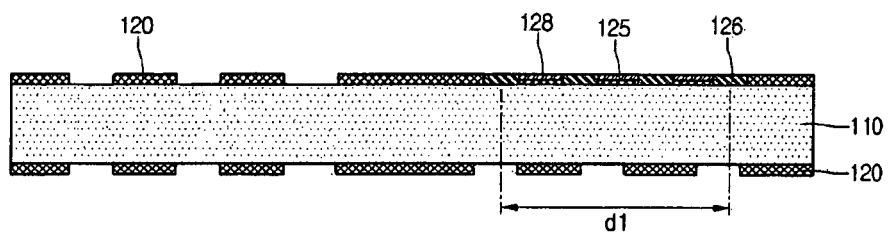

Thereafter, as shown in FIG. 9, a surface treatment layer 128 may be additionally formed by performing oxide treatment with respect to the surface of the cavity circuit pattern 125.

In addition, the surface treatment layer 128 may be not only formed through the oxide treatment, but also formed in a single layer structure or a multiple layer structure by plating the alloy of one of Cu, Ni, Pd, Au, Sn, Ag, and Co, the binary alloy thereof, or the ternary alloy thereof.

Figure 10:
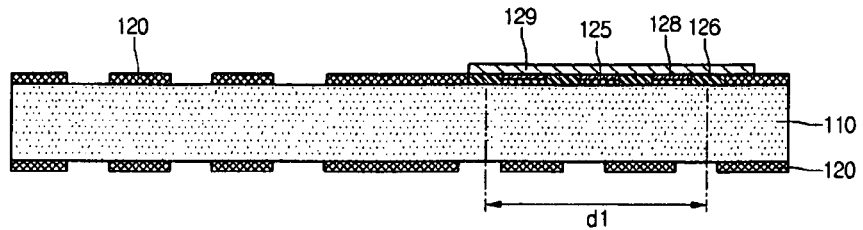

Next, as shown in FIG. 10, a heat-resistant cavity separation layer 129 having the weak adhesion strength is formed in the cavity region.

The cavity separation layer 129 is wider than the cavity region to cover the whole cavity region.

When the cavity region is processed by a laser drill thereafter, the cavity separation layer 129 is cut together with the insulating layer 130 to serve as a separation layer to separate the cut insulating layer 130.

The cavity separation layer 129 may include a heat-resistant material having weak adhesion strength. In particular, the cavity separation layer 129 is preferably provided in the form of a tape for the purpose of the manufacturing process, so that the cavity separation layer 129 can be easily attached or detached. For example, the cavity separation layer 129 may include an insulating layer including one of epoxy, phenolic resin, prepreg, polyimide, and ABF. Preferably, the cavity separation layer 129 may be simply formed by attaching a PI (polyimide) tape.

Figure 11:
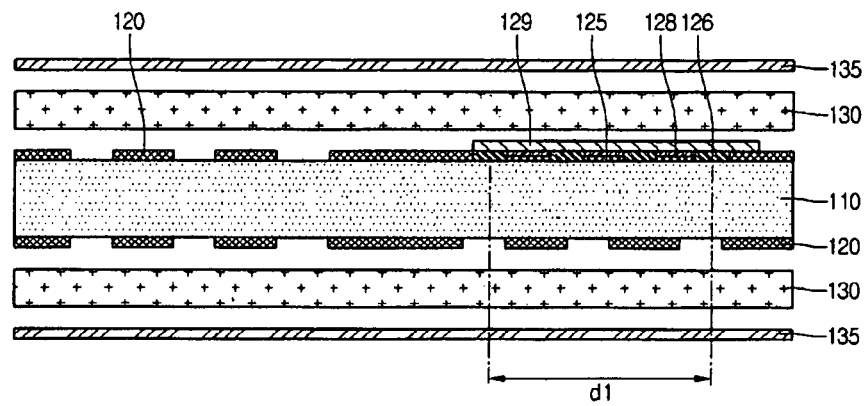
Figure 12:
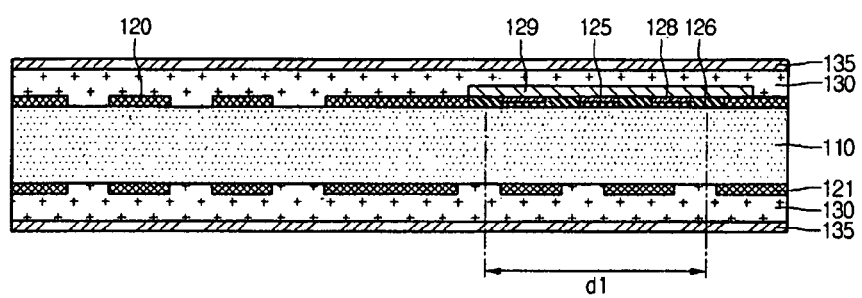

Then, as shown in FIGS. 11 and 12, at least one of the insulating layer 130 and the metallic layer 135 is stacked on the upper portion or the lower portion of the base substrate 110 and patterned, thereby sequentially forming the interlayer circuit layers.

Figure 13:
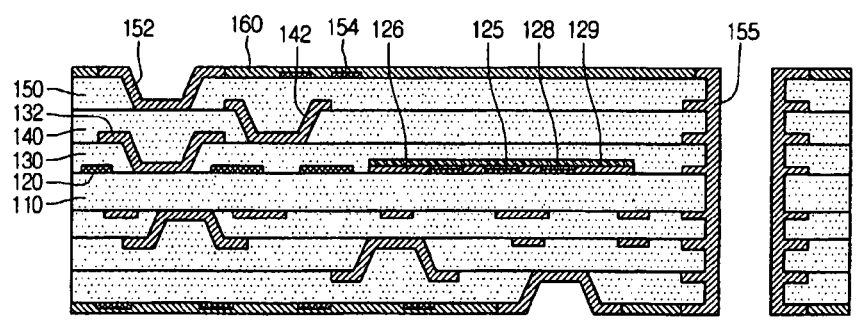

While repeating the process of FIGS. 11 and 12, a portion of the insulating layer 130 is open, so that the lower interlayer circuit layer is exposed, and the vias 132, 142, and 152 are formed through a plating process, thereby forming a multi-layer circuit board of FIG. 13.

In this case, the conductive through hole 155 may be formed from the upper most portion to the lower most portion of the multi-layer circuit board, and a typical build-up process can be performed to form the vias 132, 142, and 152 electrically conducted the internal circuit layer 120 and another circuit layer.

After forming the outer circuit layer 154 on the third insulating layer 150 serving as the outer most insulating layer, the cover layer 160 is formed on the third insulating layer 150 by using a solder resist.

The cover layer 160 buries the outer circuit layer 154 and exposes the via 152 positioned at the outer most surface and the through hole 155.

Then, the cavity C is formed at the cavity region of the multi-circuit board of FIG. 13.

Figure 14:
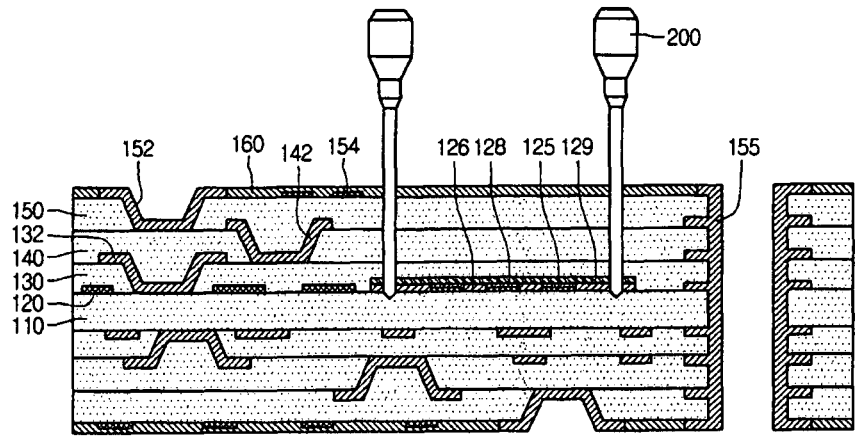

In order to form the cavity C, positions to process the cavity C are aligned by using a laser drill 200 as shown in FIG. 14, and the focal length of the laser drill 200 is adjusted to the extent that an LS is formed at a predetermined depth on the surface of the base substrate 110 by the laser drill 200.

The laser drilling is performed from the outer most surface to the surface of the base substrate 110.

Figure 15:
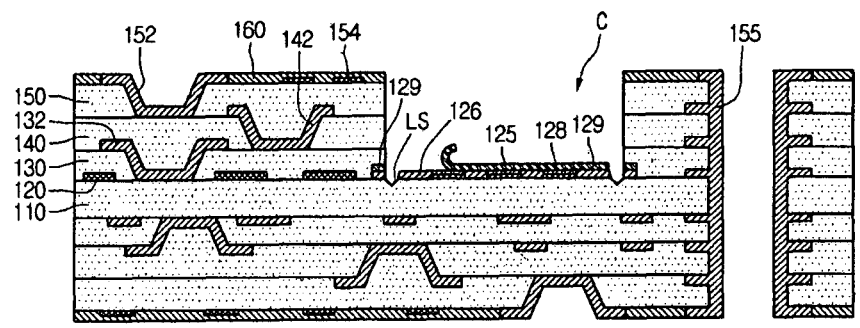

Then, as shown in FIG. 15, if the insulating layers 130, 140, and 150 of the cavity region, which are partitioned by the laser drill 200, are cut off, the insulating layers 130, 140, and 150 can be easily removed due to the low adhesion strength of the cavity separation layer 129.

As described above, the insulating layers are cut by a preset depth of the cavity C by controlling the focal length of the laser drill 200, so that the cavity C may be formed.

Accordingly, the cavity C of FIG. 15 is formed, and the cavity circuit pattern 125 is exposed, so that a passive device or an active device electrically connected to the cavity circuit pattern 125 may be installed in the cavity C.

Hereinafter, a printed circuit board according to another embodiment of the present invention will be described with reference to FIGS. 16 to 28.

Figure 16:
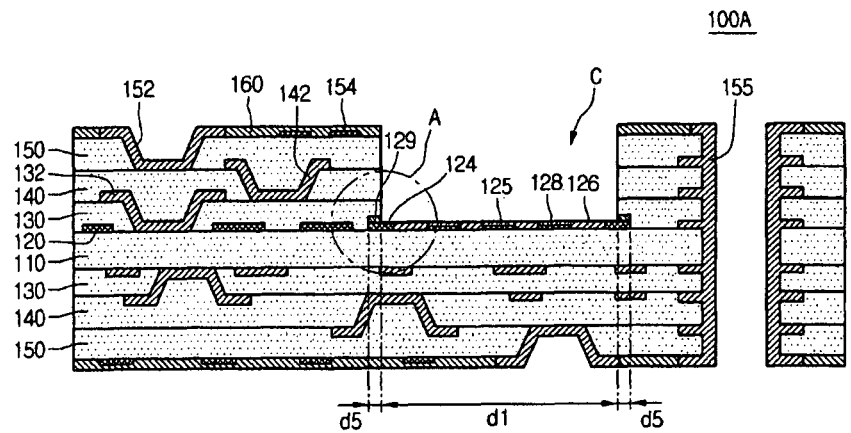
FIG. 16 is a sectional view showing a PCB according to another embodiment of the present invention.
Figure 17:
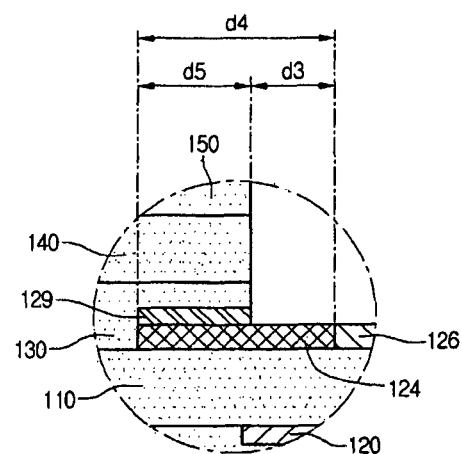
FIG. 17 is an enlarged view of a region A of FIG. 16.

FIG. 16 is a sectional view showing a printed circuit board according to another embodiment of the present invention, and FIG. 17 is an enlarged view showing a region A of FIG. 16.

Referring to FIGS. 16 to 17, a printed circuit board 100A according to the present invention is a multi-layer printed circuit board including a circuit pattern layer having a multi-layer structure, and includes a base circuit board including the internal circuit layers 120.

The base circuit board includes a base substrate 110 and the internal circuit layers 120 formed at both of upper and lower portions of the base substrate 110.

The base substrate 110 includes an insulating substrate. The base substrate 110 may include thermosetting substrate, thermoplastic polymer substrate, a ceramic substrate, an organic-inorganic composite material substrate, or a glass fiber impregnation substrate. If the base substrate 110 includes a polymer resin, the base substrate 110 may include an epoxy-based insulating resin, or may include polyimide-based resin.

The internal circuit layers 120 are formed at the upper and lower portions of the base substrate 110. The portion of the internal circuit layer 120 includes the cavity circuit pattern 125 exposed in a cavity region for the cavity C with a first width d1.

The cavity circuit pattern 125 includes an etch stop layer 124 extending while passing through the boundary region of the cavity C.

The etch stop layer 124 extends through the boundary region of the cavity C and has a fourth width d4 including a third width d3 inside the cavity C and a fifth width d5 outside the cavity C.

In addition to the cavity circuit pattern 125, the internal circuit layer 120 is buried in the insulating layer 130. The insulating layers 140 and 150 are formed on the first insulating layer 130.

The second and third insulating layers 140 and 150 formed on the first insulating layer 130 may include resin insulating layers including the same material.

Although FIG. 2 shows the insulating layers 130, 140 and 150, the number of the insulating layers may vary, and insulating layers and interlayer circuit layers different from each other in number may be formed at the upper and lower portions of the base circuit board.

An interlayer circuit layer (not shown) is formed between two of the first to third insulating layers 130, 140, and 150, and the vias 132, 142, and 152 are formed in the first to third insulating layers 130, 140, and 150 so that the vias 132, 142, and 152 connect interlayer circuit layers to each other.

Through a typical build-up process, the insulating layers 130, 140, and 150 may be stacked, the interlayer circuit layers may be formed, and the vias 132, 142, and 152 may be formed.

The outer circuit layer 154 is formed on the third insulating layer 150 serving as the upper most layer in the printed circuit board 100A of FIG. 16, and the via 152 connecting the outer circuit layer 154 to the lower interlayer circuit layer is formed in the third insulating layer 150.

The printed circuit board 100 may include a conductive through hole 155 penetrating from the upper most layer of the printed circuit board 100A to the lower most layer of the printed circuit board 100.

The cover layer 160 may be staked on the third insulating layer 150 to bury the outer circuit layer 154 and expose the through hole 155 and the via 152.

The cover layer 160 may include a dry film or a solder resist.

Hereinafter, the inner part of the cavity C will be described in detail. The cavity circuit patterns 125 are formed in the cavity region for the cavity C having the first width d1.

As described above, the etch stop layer 124 of the cavity circuit pattern 125 extends through the boundary region of the cavity C. In detail, the etch stop layer 124 extend from the boundary region to the outer portion of the cavity C by the fifth d5.

The etch stop layer 124 serves as a stopper in the laser drilling process to form the cavity C. A portion of the etch stop layer 124 is exposed in the cavity region, and a remaining region of the etch stop layer 124 is buried in the first to third insulating layers 130, 140, and 150 outside the cavity C.

A portion of the cavity separation layer 129 is formed on the etch stop layer 124 having the fifth width d5 and buried in the first to third insulating layers 130, 140, and 150

The cavity separation layer 129 represents weaker adhesion strength with a metallic layer constituting the etch stop layer 124 than with the first insulating layer 130. The cavity separation layer 120 includes heat-resistant material, preferably, a portion of a releasing film having the form of a tape.

The cavity separation layer 129 may include an insulating layer having the form of a tape and including one of epoxy, phenolic resin, prepreg, polyimide, and ABF. Preferably, the cavity separation layer 129 may include a portion of a polyimide tape.

As described above, the metallic etch stop layer 124 is formed at the boundary region of the cavity C subject to the laser drilling process, and the cavity separation layer 129 is attached to the etch stop layer 124, so that an insulating layer filled in the cavity C can be easily removed by the cavity separation layer 129 after the laser drilling process has been performed.

Hereinafter, a method for manufacturing the printed circuit board 100A of FIG. 16 will be described with reference to FIGS. 18 to 28.

Figure 18:
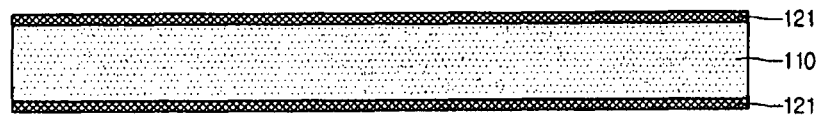
FIGS. 18 to 28 are sectional views showing a method for manufacturing the PCB of FIG. 16.

First, as shown in FIG. 18, a copper foil composite including the metallic layers 121 formed at both lateral sides of the insulating base substrate 110 is prepared.

The metallic layer 121 may include a copper foil including copper (Cu) or may include the alloy including aluminum (Al), gold (Au), or silver (Ag).

Figure 19:
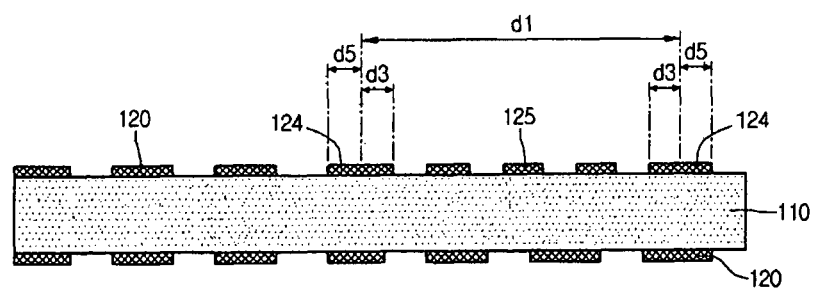

Next, as shown in FIG. 19, the metallic layers 121 formed at both lateral sides of the base substrate 110 are patterned to form the internal circuit layers 120.

Portions of the internal circuit layers 120 serve as the cavity circuit patterns 125 exposed in the cavity C, and are formed together with the etch stop layer 124 having the fourth width d4 along the boundary region of the cavity region.

In this case, the etch stop layer 124 is formed at the boundary region of the cavity C in such a manner that the etch stop layer 124 has the fifth width d5 outside the cavity region and has the third width d3 in the cavity region.

As shown in FIG. 19, a structure including the internal circuit layer 120 formed at both lateral sides of the base substrate 110 is defined as the base circuit board.

Figure 20:
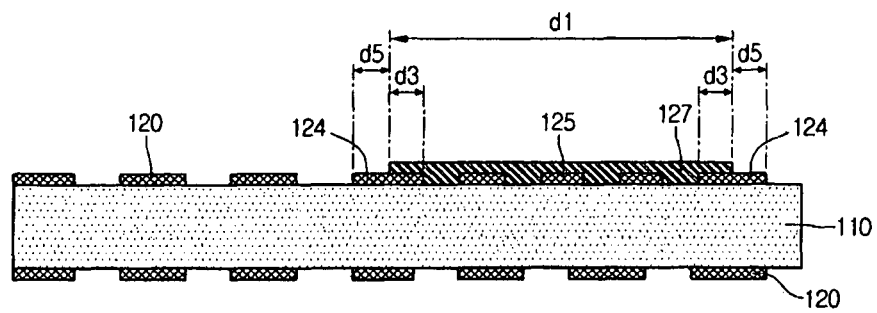
Figure 21:
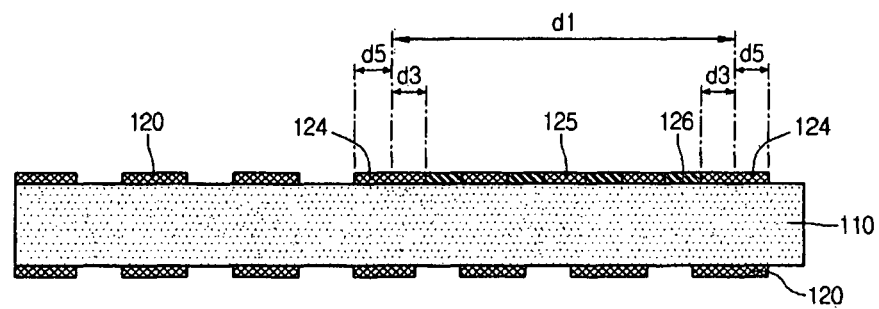

Then, as shown in FIG. 20, after printing the solder resist (PSR) 127 in the cavity region, the solder resist 127 of the cavity region is exposed, thereby forming the solder resist pattern 126 between the cavity circuit patterns 125 in the cavity region as shown in FIG. 21.

Figure 22:
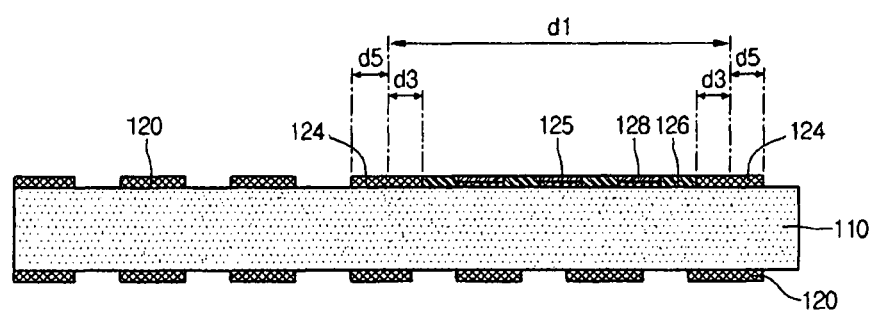

Thereafter, as shown in FIG. 22, the surface treatment layer 128 may be additionally formed by performing oxide treatment with respect to the surface of the cavity circuit pattern 125.

In addition, the surface treatment layer 128 may be not only formed through the oxide treatment, but also formed in a single layer structure or a multiple layer structure by plating the alloy of one of Cu, Ni, Pd, Au, Sn, Ag, and Co, the binary alloy thereof, or the ternary alloy thereof.

Figure 23:
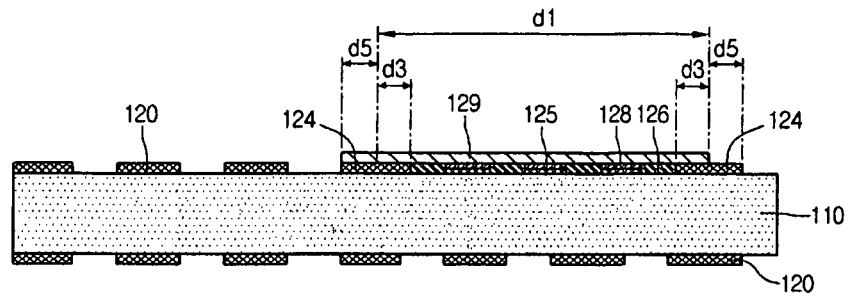

Next, as shown in FIG. 23, the heat-resistant cavity separation layer 129 having the weak adhesion strength is formed in the cavity region.

The cavity separation layer 129 is wider than the cavity region to cover the whole cavity region and the fifth width d5 of the etch stop layer 124.

The etch stop layer 124 and the cavity separation layer 129 are stacked at the boundary region of the cavity region.

When the cavity region is processed by a laser drill thereafter, the cavity separation layer 129 is cut together with the insulating layer 130 to serve as a separation layer to separate the cut insulating layer 130.

The cavity separation layer 129 may include a heat-resistant material having a weak adhesion strength. In particular, the cavity separation layer 129 is preferably provided in the form of a tape for the purpose of the manufacturing process, so that the cavity separation layer 129 can be easily attached or detached. For example, the cavity separation layer 129 may include an insulating layer including one of epoxy, phenolic resin, prepreg, polyimide, and ABF. Preferably, the cavity separation layer 129 may be simply formed by attaching a PI (polyimide) tape.

Figure 25:
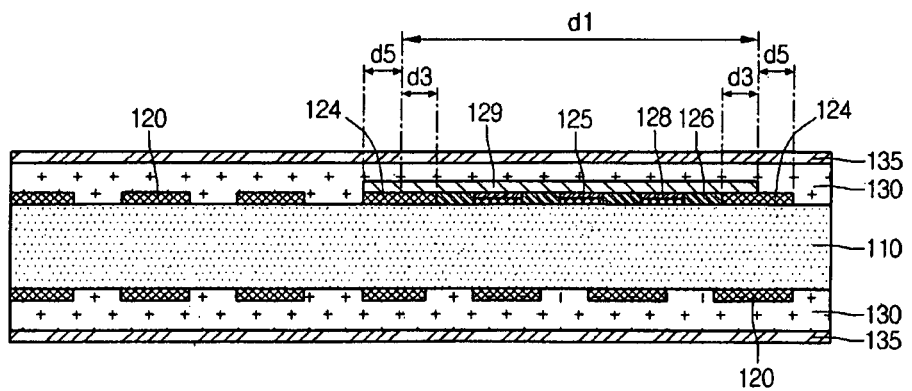

Then, as shown in FIGS. 124 and 25, at least one pair of the insulating layer 130 and the metallic layer 135 are stacked on the upper portion or the lower portion of the base substrate 110 and patterned, thereby sequentially forming the interlayer circuit layers.

Figure 24:
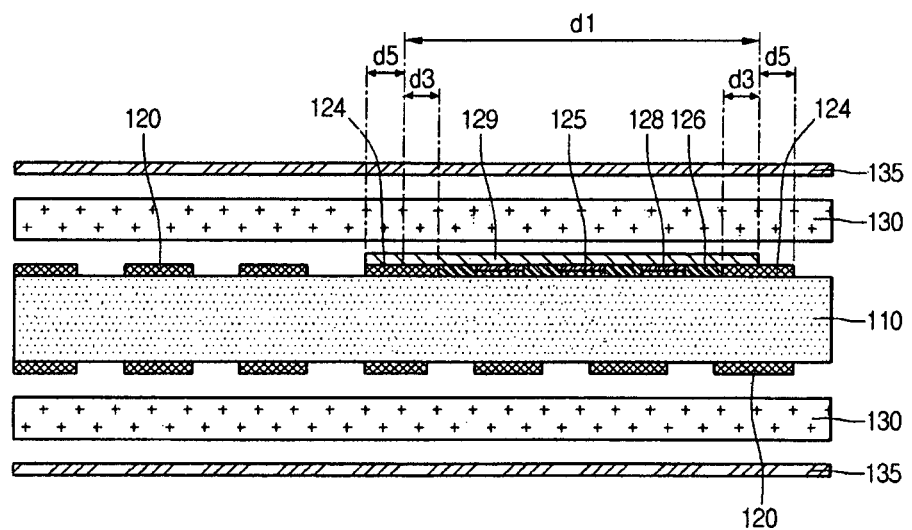
Figure 26:
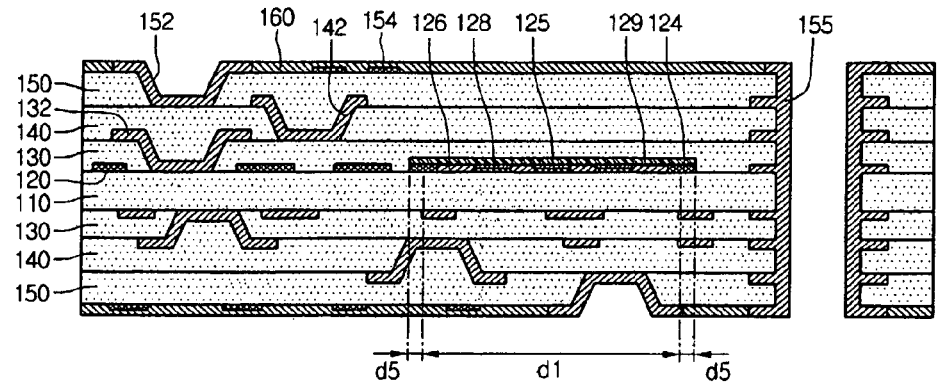

While repeating the process of FIGS. 24 and 25, a portion of the insulating layer 130 is open, so that the lower interlayer circuit layer is exposed, and the vias 132, 142, and 152 are formed through a plating process, thereby forming a multi-layer circuit board of FIG. 26.

In this case, the conductive through hole 155 may be formed from the upper most portion to the lower most portion of the multi-layer circuit board, and a typical build-up process can be performed to form the vias 132, 142, and 152 electrically conducted with the internal circuit layer 120 and another circuit layer.

After forming the outer circuit layer 154 on the third insulating layer 150 serving as the outer most insulating layer, the cover layer 160 is formed on the third insulating layer 150 by using a solder resist.

The cover layer 160 buries the outer circuit layer 154 and exposes the via 152 positioned at the outer most surface and the through hole 155.

Figure 27:
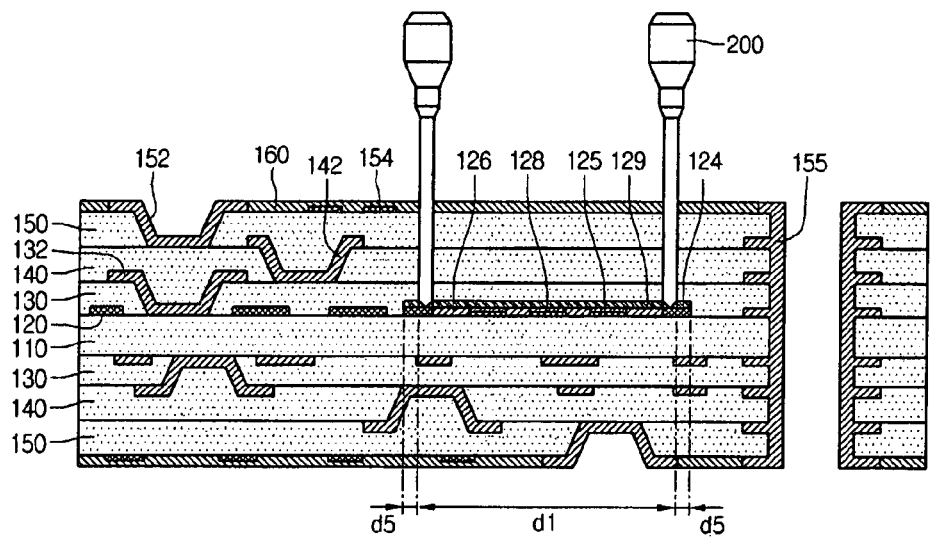

Then, the cavity C is formed at the cavity region of the multi-circuit board of FIG. 27.

In order to form the cavity C, positions to process the cavity C are aligned by using the laser drill 200 as shown in FIG. 27, and the focal length of the laser drill 200 is adjusted to the extent that an LS is formed at a predetermined depth on the surface of the base substrate 110 by the laser drill 200.

The laser drilling process is performed from the upper most layer to the etch stop layer 124. If the cavity separation layer 129 on the etch stop layer 124 is cut so that the laser drill 200 reaches the etch stop layer 124, the laser drill 200 is automatically stopped.

Figure 28:
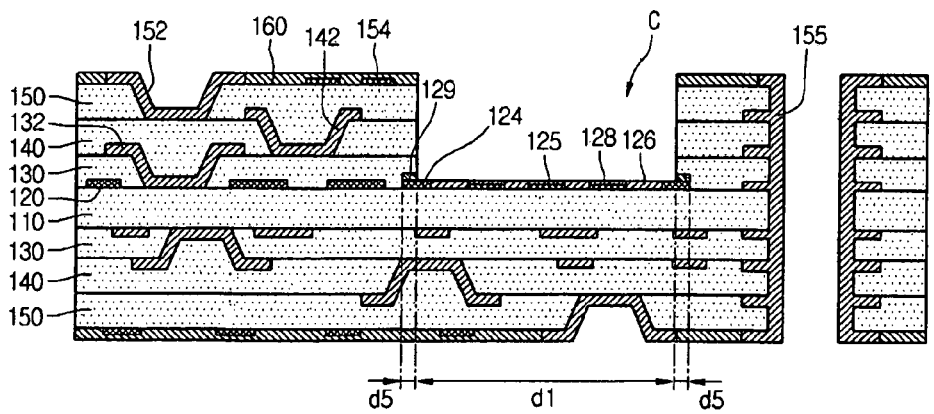

Then, as shown in FIG. 28, if the insulating layers 130, 140, and 150 of the cavity region, which are partitioned by the laser drill 200, are cut off, the insulating layers 130, 140, and 150 can be easily removed due to the low adhesion strength between the cavity separation layer 129 and the etch stop layer 124.

As described above, the edge of the cut cavity separation layer 129, which will be removed, makes contact with the etch stop layer 124, so that the cavity separation layer 129 can be easily delaminated from the edge thereof due to the weak adhesion strength with metal.

Therefore, the cavity C of FIG. 28 is formed, and the cavity circuit pattern 125 is exposed, so that a passive device or an active device electrically connected to the cavity circuit pattern 125 may be installed in the cavity C.

Although the exemplary embodiments of the disclosure have been described, it is understood that the disclosure should not be limited to these exemplary embodiments but various changes and modifications can be made by one ordinary skilled in the art within the spirit and scope of the disclosure as hereinafter claimed.

The invention claimed is:

1. A printed circuit board including a cavity, the printed circuit board comprising:
   a base substrate;
   an insulating layer on the base substrate and including the cavity;
   a circuit layer on the base substrate and including a first circuit pattern buried in the insulating layer and a second circuit pattern exposed by the cavity;
   a cavity separation pattern on the base substrate, buried in the insulating layer, and surrounding the cavity; and
   a solder resist pattern on the base substrate;
   wherein the solder resist pattern comprises:
      a first solder resist pattern on the base substrate and exposed by the cavity; and
      a second solder resist pattern on the base substrate and buried in the insulating layer;
   wherein the cavity separation pattern is formed on the second solder resist pattern buried in the insulating layer.

2. The printed circuit board of claim 1, wherein the base substrate comprises a groove formed along a boundary region of the cavity.

3. The printed circuit board of claim 1, wherein side surfaces of the second solder resist pattern and the cavity separation pattern are exposed by the cavity.

4. The printed circuit board of claim 1, further comprising:
   a surface treatment layer on the second circuit pattern exposed by the cavity,
   wherein a top surface of the solder resist pattern lies in the same plane as a top surface of the surface treatment layer.

5. The printed circuit board of claim 1, wherein the circuit layer includes an etch stop pattern formed at a boundary region of the cavity, and the insulating layer buries a portion of the etch stop pattern.

6. The printed circuit board of claim 5, wherein the cavity separation pattern is formed on a portion of the etch stop pattern buried in the insulating layer.

7. The printed circuit board of claim 5, wherein a remaining region of the etch stop pattern is exposed by the cavity.

8. The printed circuit board of claim 5, wherein the cavity separation pattern represents weaker adhesion strength with the etch stop pattern than adhesion strength with the insulating layer.

9. A method for manufacturing a printed circuit board, the method comprising:
- forming a base circuit board including a first circuit pattern outside a cavity region and a second circuit pattern in the cavity region;
- forming a solder resist pattern on the cavity region of the base circuit board;
- forming a cavity separation layer on the second circuit pattern;
- forming an insulating layer on the base circuit board;
- cutting the insulating layer and the cavity separation layer by controlling a focal length of a laser beam such that the laser beam reaches up to a surface of the base circuit board; and
- removing the insulating layer by separating the cavity separation layer to form the cavity;
- wherein the cavity separation layer has a width wider than a width of the cavity region,
- wherein a portion of the cavity separation layer is buried in the insulating layer and surrounds the cavity;
- wherein the solder resist pattern comprises:
  - a first solder resist pattern on the base substrate and exposed by the cavity; and
  - a second solder resist pattern on the base substrate and buried in the insulating layer; and
- wherein a portion of the cavity separation layer is formed on the second solder resist pattern buried in the insulating layer.

10. The method of claim 9, wherein the base circuit board includes a plurality of second circuit patterns in the cavity region, and
- wherein the solder resist pattern is formed between the second circuit patterns.

11. The method of claim 9, further comprising forming an oxide layer on an upper portion of the second circuit pattern.

12. The method of claim 9, wherein the cutting the insulating layer includes irradiating the laser beam to the base circuit board by controlling the focal length of the laser beam such that a groove is formed in the surface of the base circuit board.

13. The method of claim 11, wherein side surfaces of the second solder resist pattern and the portion of the cavity separation layer are exposed by the cavity.

14. The method of claim 11, wherein a top surface of the solder resist pattern lies in the same plane as a top surface of the oxide layer.

15. A method of manufacturing a printed circuit board including a cavity, the method comprising:
- forming a base circuit board including a first circuit pattern outside a cavity region, a second circuit pattern in the cavity region, and a third circuit pattern along an edge of the cavity region;
- forming a solder resist pattern on the cavity region of the base circuit board;
- forming an oxide layer on the second circuit pattern;
- forming a cavity separation layer on the second circuit pattern and the third circuit pattern;
- forming an insulating layer on the base circuit board;
- cutting the insulating layer and the cavity separation layer on the third circuit pattern through laser drilling; and
- forming the cavity by removing the insulating layer which is cut as the cavity separation layer is separated from the third circuit pattern;
- wherein the cavity separation layer has a width wider than a width of the cavity region,
- wherein a portion of the cavity separation layer is buried in the insulating layer, and
- wherein a top surface of the solder resist pattern lies in the same plane as a top surface of the oxide layer.

16. The method of claim 15, wherein a side surface of the buried portion of the cavity separation layer is exposed by the cavity.

17. The method of claim 15, wherein the forming the cavity separation layer includes attaching an insulating tape onto the third circuit pattern and the second circuit pattern.

* * * * *